(12) United States Patent
Tsuji et al.

(10) Patent No.: US 11,387,121 B2
(45) Date of Patent: Jul. 12, 2022

(54) SUBSTRATE TREATING APPARATUS AND SUBSTRATE TREATING SYSTEM INCLUDING PIN LIFT MECHANISM BELOW COOLING BASE AND HEAT PLATE

(71) Applicant: SCREEN Holdings Co., Ltd., Kyoto (JP)

(72) Inventors: Tatsuhisa Tsuji, Kyoto (JP); Yasuhiro Fukumoto, Kyoto (JP); Yasuhiro Shiba, Kyoto (JP)

(73) Assignee: SCREEN Holdings Co., Ltd.

( * ) Notice: Subject to any disclaimer, the term of this patent is extended or adjusted under 35 U.S.C. 154(b) by 819 days.

(21) Appl. No.: 16/257,206

(22) Filed: Jan. 25, 2019

(65) Prior Publication Data

US 2019/0273005 A1 Sep. 5, 2019

(30) Foreign Application Priority Data

Mar. 2, 2018 (JP) .............................. JP2018-037245

(51) Int. Cl.
*H01L 21/67* (2006.01)
*H01L 21/677* (2006.01)
*H01L 21/687* (2006.01)

(52) U.S. Cl.
CPC .... *H01L 21/67103* (2013.01); *H01L 21/6719* (2013.01); *H01L 21/67109* (2013.01); *H01L 21/67178* (2013.01); *H01L 21/67739* (2013.01); *H01L 21/67748* (2013.01); *H01L 21/68742* (2013.01)

(58) Field of Classification Search
CPC ......... H01L 21/67103; H01L 21/67109; H01L 21/67178; H01L 21/67098; H01L 21/67115; H01L 21/6719; H01L 21/67739; H01L 21/67748; H01L 21/68742; H01L 21/68785

See application file for complete search history.

(56) References Cited

U.S. PATENT DOCUMENTS

| | | | |
|---|---|---|---|
| 2009/0156019 A1* | 6/2009 | Satoh | ............... H01L 21/67115 438/798 |
| 2017/0032997 A1 | 2/2017 | Willwerth et al. | |
| 2018/0021806 A1 | 1/2018 | Inagaki | |

FOREIGN PATENT DOCUMENTS

| | | |
|---|---|---|
| JP | H05-283500 A | 10/1993 |
| JP | H11-204428 A | 7/1999 |
| JP | 2000-003843 A | 1/2000 |
| JP | 2000-114343 A | 4/2000 |

(Continued)

OTHER PUBLICATIONS

Office Action dated Dec. 30, 2019 for corresponding Republic of China Patent Application No. 108103037.

(Continued)

*Primary Examiner* — John P. Dulka
(74) *Attorney, Agent, or Firm* — Ostrolenk Faber LLP

(57) ABSTRACT

Disclosed is a substrate treating apparatus that performs a heat treatment to a substrate. The apparatus includes the following elements: a heat treating plate that heats the substrate; lift pins that deliver the substrate, a lift pin drive mechanism that causes the lift pins to move upwardly/downwardly; a casing that produces a heat treatment atmosphere; and a cooling base plate that suppresses transmission of heat from the heat treating plate. The lift pin drive mechanism is disposed below the cooling base plate.

15 Claims, 6 Drawing Sheets

(56) References Cited

FOREIGN PATENT DOCUMENTS

| | | |
|---|---|---|
| JP | 2008-034739 A | 2/2008 |
| JP | U3205145 A | 7/2016 |
| KR | 10-2013-0135110 A | 12/2013 |
| KR | 10-2016-0048634 A | 5/2016 |
| TW | 201806103 A | 2/2018 |

OTHER PUBLICATIONS

Office Action dated Apr. 28, 2020 for corresponding Korean Application No. 10-2019-0011207.
Office Action dated Dec. 28, 2021 for corresponding Japanese Patent Application No. 2018-037245.

* cited by examiner

SUBSTRATE TREATING APPARATUS AND SUBSTRATE TREATING SYSTEM INCLUDING PIN LIFT MECHANISM BELOW COOLING BASE AND HEAT PLATE

BACKGROUND OF THE INVENTION

1. Field of the Invention

The present invention relates to a substrate treating apparatus and a substrate treating system that perform a heat treatment to various types of substrates such as a semiconductor wafer, a substrate for liquid crystal display, a substrate for plasma display, a substrate for organic EL, a substrate for field emission display (FED), a substrate for optical display, a magnetic disk substrate, an optical magnetic disk substrate, a substrate for a photomask, and a solar cell substrate (hereinafter, simply referred to as a substrate.)

2. Description of the Related Art

Examples of the currently-used apparatus of this type include one having a heat treating plate, lift pins, a cover member, a casing, a top board, and a positioning member. The heat treating plate heats a substrate placed thereon. The lift pins are provided in the heat treating plate for delivering the substrate. The cover member is configured to cover the above of the heat treating plate, to be liftable relative to the heat treating plate, and to produce a heat treatment atmosphere by the heat treating plate. The casing covers the heat treating plate and the cover member. The top board is arranged between the ceiling surface of the cover member and a top face of the heat treating plate. The positioning member adjusts a gap between a lower face of the top board and the top face of the heat treating plate. See, for example, Japanese Unexamined Patent Publication No. 2000-3843A.

In the substrate treating apparatus with such a configuration as above, a drive mechanism that lifts the cover member and the lift pins and a control device that controls these elements are disposed laterally, i.e., externally of the casing.

However, the currently-used apparatus having such a configuration as above possesses the following drawback. Specifically, if the currently-used apparatus has the drive mechanism such as an air cylinder and a motor arranged inside of the casing, the drive mechanism may suffer breakdown due to heat from the heat treating plate. Consequently, it becomes difficult to arrange the drive mechanism inside of the casing. Accordingly, this leads to a drawback of enlarging a footprint of the apparatus.

Recently, in particular, an underlayer film called a coating carbon film is occasionally formed for microfabrication process. In order to form the underlayer film, a heat treatment at higher temperatures of 300 to 500° C. is performed relative to the currently-performed heat treatment at temperatures of 100 to 150° C. At such high temperatures, the drive mechanism may suffer breakdown by a heat influence with a highly increased possibility, leading to more difficulty in arrangement of the drive mechanism inside of the casing. Such a circumstances is also conceivable.

In contrast to this, if the drive mechanism is disposed inside of the casing for achieving a reduced footprint while suppressing the heat influence from the heat treating plate, the drive mechanism has to be disposed at a position spaced away from the heat treating plate largely downwardly. Consequently, since the apparatus becomes extremely high, it is impracticable to reduce the footprint by the arrangement of the drive mechanism inside of the casing.

SUMMARY OF THE INVENTION

The present invention has been made regarding the state of the art noted above, and its one object is to provide a substrate treating apparatus and a substrate treating system that allow a reduced footprint with suppressed heights by heat separation.

The present invention is constituted as stated below to achieve the above object.

One aspect of the present invention provides a substrate treating apparatus that performs a heat treatment to a substrate. The apparatus includes: a heat treating plate that heats the substrate placed thereon; lift pins that deliver the substrate; a lift pin drive mechanism that causes the lift pins to move upwardly/downwardly relative to a top face of the heat treating plat; a casing that covers surroundings of the heat treating plate to produce a heat treatment atmosphere by the heat treating plate; and a cooling base plate above which the heat treating plate is placed to suppress transmission of heat from the heat treating plate downwardly. The lift pin drive mechanism is disposed below the cooling base plate.

With the aspect of the present invention, the cooling base plate performs heat separation, leading to suppression in heat transmission from the heat treating plate downwardly from the heat treating plate. Accordingly, this allows suppression in heat transmission from the heat treating plate to the lift pin drive mechanism disposed below the cooling base plate. As the result, the lift pin drive mechanism is capable of being disposed inside of the casing without any large gap downwardly from the heat treating plate. This achieves a reduced footprint of the apparatus with a suppressed height.

Moreover, the casing according to the aspect of the present invention includes a load/unload opening that is used for loading/unloading the substrate, and further includes a shutter body that opens/closes the load/unload opening, and a shutter body drive mechanism that drives the shutter body. The shutter body drive mechanism is disposed below the cooling base plate. It is preferred that the lift pin drive mechanism is attached to a lower face of the cooling base plate in such a condition that heat conduction is performed between the lift pin drive mechanism and the cooling base plate.

Accordingly, this allows suppression in heat transmission from the heat treating plate to the shutter body drive mechanism that is disposed below the cooling base plate. As the result, the shutter body drive mechanism is capable of being disposed inside of the casing without any large gap downwardly from the heat treating plate. This achieves a reduced footprint of the apparatus with a suppressed height.

It is preferred in the aspect of the present invention that the lift pin drive mechanism is attached to the lower face of the cooling base plate in such a condition that heat conduction is performed between the lift pin drive mechanism and the cooling base plate.

The lift pin drive mechanism is attached to the lower face of the cooling base plate directly or via a heat conductive member in a heat conductive manner. Accordingly, the lift pin drive mechanism is caused to be cooled by the cooling base plate, leading to suppression in rise of temperature of the lift pin drive mechanism by the heat treating plate. In addition, the lift pin drive mechanism is capable of being attached to the cooling base plate in various manners via the heat conductive member, leading to an enhanced flexibility for attachment.

It is preferred in the aspect of the present invention that the shutter body drive mechanism is attached to on the lower face of the cooling base plate in such a condition that heat conduction is performed between the shutter body drive mechanism and the cooling base plate.

The shutter body drive mechanism is attached to the lower face of the cooling base plate directly or via a heat conductive member in a heat conductive manner. Accordingly, the shutter body drive mechanism is caused to be cooled by the cooling base plate, leading to suppression in rise of temperature of the shutter body drive mechanism by the heat treating plate. In addition, the lift pin drive mechanism is capable of being attached to the cooling base plate in various manners via the heat conductive member, leading to an enhanced flexibility for attachment.

It is also preferred in the aspect of the present invention that the cooling base plate includes a refrigerant channel formed thereover for causing a refrigerant to flow.

Providing the cooling base plate that performs cooling by causing the refrigerant to flow positively into the refrigerant channel allows efficient absorption of the heat from the heat treating plate. Accordingly, this achieves suppression in heat transmission from the heat treating plate downwardly of the cooling base plate.

It is preferred in the aspect of the present invention that the substrate treating apparatus further includes a plurality of struts disposed between a lower face of the heat treating plate and a top face of the cooling base plate, and that the heat treating plate is attached to the cooling base plate via the plurality of struts.

The heat treating plate is attached to the cooling base plate via the struts while the lower face of the heat treating plate is spaced away from the cooling base plate. Consequently, this allows the heat by the heat conduction from the heat treating plate to be transmitted from only the struts. As a result, suppression in rise of temperature of the cooling base plate by the heat conduction is performable, leading to an increased degree of heat separation by the cooling base plate.

Another aspect of the present invention provides a substrate treating system including the substrate treating apparatus multilayered in a stack manner, the substrate treating apparatus each having in an upper portion thereof a heat separation plate that suppresses upward heat transmission.

The substrate treating system including the substrate treating apparatus multilayered in the stack manner is capable of suppressing downward heat transmission of the heat treating plate within the casing of each of the substrate treating apparatus. On the other hand, the heat from the heat treating plate is transmitted upwardly. This may cause the lift pin drive mechanism disposed in the upper portion of the substrate treating apparatus to suffer an adverse effect. Accordingly, the heat separation plate is disposed in the upper part of each of the substrate treating apparatus, achieving suppression in suffering the adverse effect described above.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The following describes one embodiment of the present invention with reference to drawings.

Figure 1:
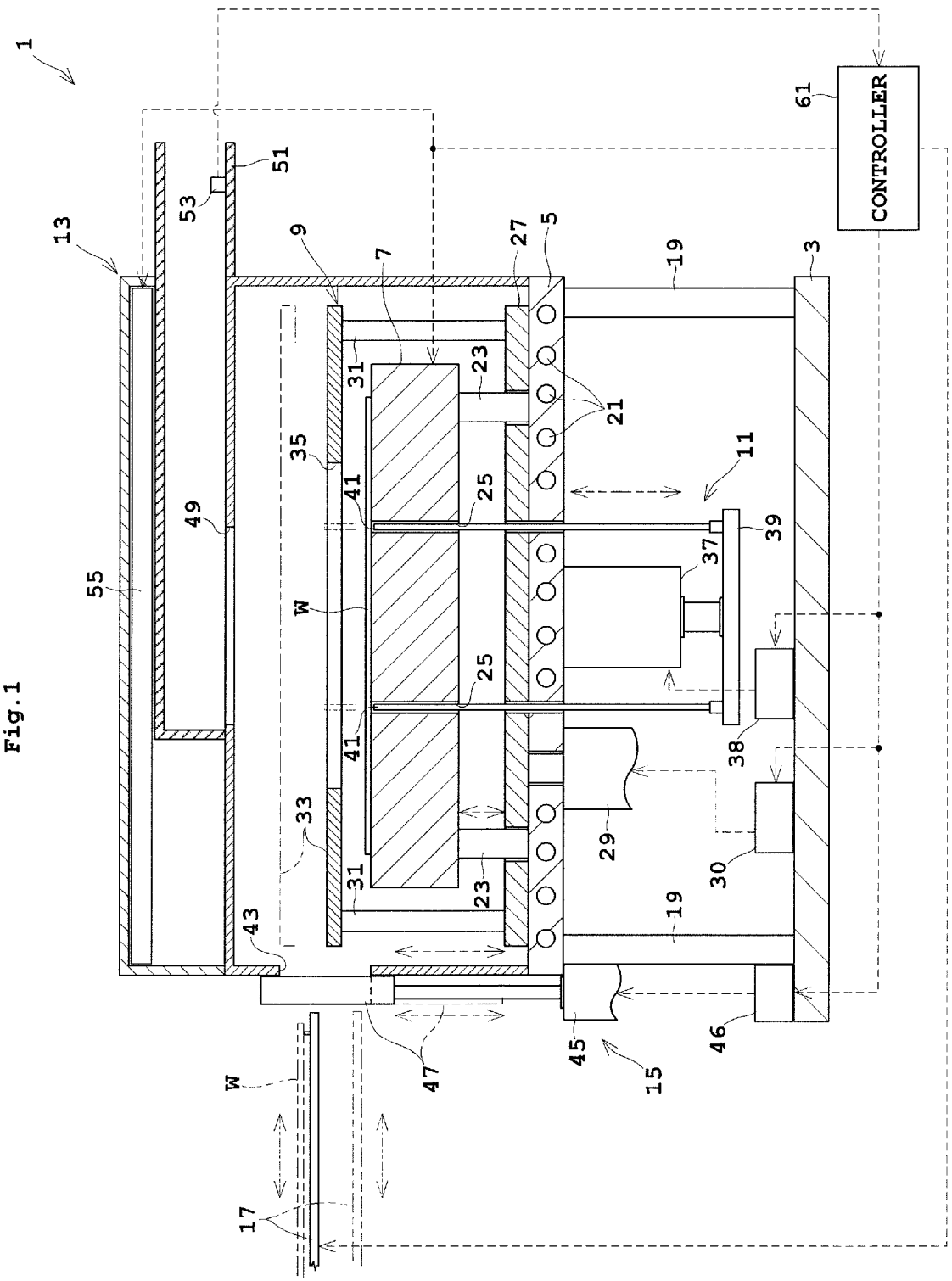
FIG. 1 schematically illustrates an entire configuration of a substrate treating apparatus according to one embodiment of the present invention.
Figure 2:
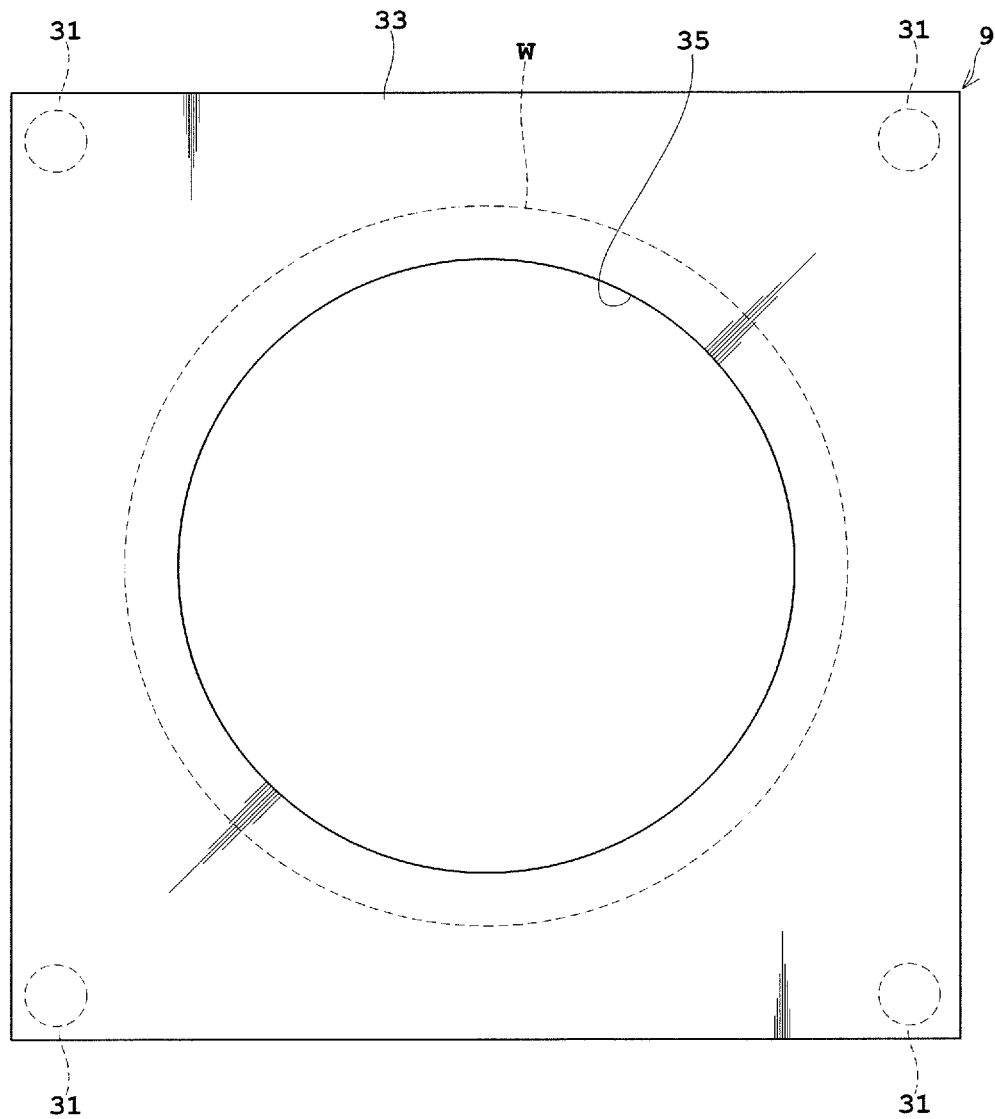
FIG. 2 is a plan view of a movable top board.
Figure 3:
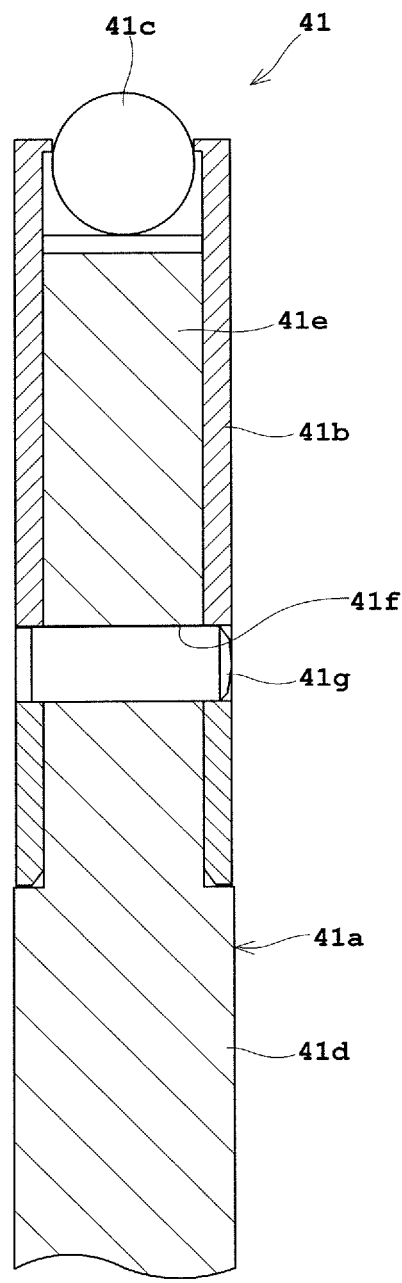
FIG. 3 is a longitudinal sectional view around a tip portion of a lift pin.

FIG. 1 schematically illustrates an entire configuration of a substrate treating apparatus according to one embodiment of the present invention. FIG. 2 is a plan view of a movable top board. FIG. 3 is a longitudinal sectional view around a tip portion of a lift pin.

A substrate treating apparatus 1 according to this embodiment performs a heat treatment to a substrate W. Specifically, a heat treatment is performed when an underlayer film called a coating carbon film is formed for microfabrication process. In order to form the underlayer film, the heat treatment at high temperatures of 300 to 500° C. is performed.

The substrate treating apparatus 1 includes a lower base plate 3, a water-cooling base plate 5, a heat treating plate 7, a movable top board 9, a lift pin unit 11, a casing 13, and a shutter unit 15.

The substrate treating apparatus 1 loads the substrate W by a transfer arm 17 disposed adjacent thereto, performs the heat treatment to the substrate W, and thereafter unloads the treated substrate W by the transfer arm 17.

Struts 19 erect on a top face of the lower base plate 3. The water-cooling base plate 5 is disposed on the struts 19. The water-cooling base plate 5 suppresses downward transmission of heat from the heat treating plate 7. Specifically, the water-cooling base plate 5 includes a refrigerant channel 21 formed over the inside thereof, for example, for allowing a refrigerant to flow. Examples of the refrigerant that flows in the refrigerant channel 21 include cooling water. The cooling water has a controlled temperature of 20° C., for example.

Here, the above-described water-cooling base plate 5 corresponds to the "cooling base plate" in the present invention.

The heat treating plate 7 is circular in plan view. The heat treating plate 7 has a diameter slightly larger than a diameter of the substrate W. The heat treating plate 7 includes a heating device, such as a heater not shown, embedded therein, and is heated such that a surface temperature thereof reaches 400° C., for example. The heat treating plate 7 is spaced away upwardly from the water-cooling base plate 5 via four struts 23 that are disposed between a lower face of the heat treating plate 7 and the top face of the water-cooling base plate 5. The heat treating plate 7 includes through holes 25 (only two of which are shown for an illustrative reason) formed therein. The through holes 25 are disposed at positions, respectively, that correspond to vertices of an equilateral triangle in plan view.

The heat treating plate 7 has a movable top board unit 9 attached thereto. The movable top board unit 9 includes a lifting base plate 27, a lifting mechanism 29, a control device 30, struts 31, and a movable top board 33.

The lifting base plate 27 includes openings for avoiding interference with the struts 23 and lift pins 41 mentioned later. The lifting mechanism 29 is formed by an air cylinder, for example. The lifting mechanism 29 is directly attached to the water-cooling base plate 5 tightly for heat conduction in such a state that a part thereof with an operating shaft is directed upwardly. The lifting mechanism 29 is fixable at a position where a tip portion of the operating shaft thereof is arranged in any level. The operating shaft of the lifting mechanism 29 is connected to a bottom face of the lifting base plate 27. The control device 30 provided with an air valve, an electromagnetic valve, and the like is disposed on the top face of the lower base plate 3 below the lifting mechanism 29. The control device 30 directly operates by switching air to be applied to the lifting mechanism 29. The control device 30 causes the operating shaft of the lifting mechanism 29 to move upwardly/downwardly, thereby allowing variation in level of the lifting base plate 27. For instance, four struts 31 erect on the top face of the lifting base plate 27. The movable top board 33 is attached to upper ends of the four struts 31.

As illustrated in FIG. 2, the movable top board 33 includes an opening 35 at a center portion thereof in plan view. The opening 35 has a diameter smaller than that of the substrate W in plan view. The lifting mechanism 29 operates, whereby the movable top board 33 moves upwardly/downwardly along with the lifting base plate 27. The movable top board 33 moves upwardly/downwardly between a lowered position where the heat treatment is performed to the substrate W and a raised position where the substrate W is loaded. Here, it is preferred that the lowered position has a clearance of approximately 10 mm between the top face of the substrate W and a lower face of the movable top board 33. This is because experiments by Inventors reveal that this clearance is suitable for enhancing in-plane uniformity of a temperature distribution on the surface of the substrate W.

The movable top board 33 is rectangular with its diagonal length longer than the diameter of the heat treating plate 7. The four struts 31 have upper ends connected to four corners of the lower face of the movable top board 33, respectively. The four corners of the movable top board 33 are far from the heat treating plate 7 as a heat source that is circular in plan view. Accordingly, if the movable top board 33 is heated due to radiant heat of the heat treating plate 7, the struts 31 are formable so as for the heat not to be transmitted thereto with ease. Consequently, the lifting mechanism 29 is unlikely to suffer influence of the heat, leading to suppression in failure.

It is preferred that the movable top board 33 mentioned above is formed by ceramic or an alloy of metal and ceramic. This avoids deformation by the heat even under the heat treatment at high temperatures.

The lift pin unit 11 includes a drive mechanism 37, a control device 38, a lifting ring 39, and three lift pins 41. Here, only two lift pins 41 are illustrated for an illustrative reason.

The drive mechanism 37 is formed by an air cylinder, for example. The drive mechanism 37 is directly attached to the lower face of the water-cooling base plate 5 tightly for heat conduction in such a state that a part thereof with an operating shaft is directed downwardly. The lower part of the operating shaft is connected to the lifting ring 39. The lifting ring 39 has a top face where three lift pins 41 erect.

The drive mechanism 37 is directly operated by the control device 38 provided with an air valve, an electromagnetic valve, and the like. The control device 38 allows control in level of the operating shaft of the drive mechanism 37 to move between two positions, i.e., a deliver position (illustrated by chain double-dashed lines in FIG. 1) and a treatment position (illustrated by solid lines in FIG. 1). In the deliver position, the three lift pins 41 protrude upwardly from the top face of the heat treating plate 7. In the treatment position, the three lift pins 41 are sunk downwardly from the top face of the heat treating plate 7. The three lift pins 41 are inserted into the three through holes 25 formed in the heat treating plate 7.

Here, the drive mechanism 37 and the control device 38 correspond to the "lift pin drive mechanism" in the present invention.

It is preferred that the lift pins 41 are each configured in such a manner as illustrated in FIG. 3. The lift pins 41 each include a core part 41a, an outer cylinder 41b, and a quartz ball 41c. The core part 41a includes a tip portion 41e that corresponds to an upper part of a barrel 41d. The tip portion 41e has a diameter smaller than the barrel 41d. The outer cylinder 41b has an internal diameter slightly larger than an external diameter of the quartz ball 41 at portions other than the tip portion. The tip portion of the outer cylinder 41b has an internal diameter slightly larger than a diameter of the quartz ball 41c. The diameter of the quartz ball 41c is slightly smaller than that of the tip portion 41e. Accordingly, when the outer cylinder 41b covers the quartz ball 41c while the quartz ball 41c is disposed on a top face of the tip portion 41e, the quartz ball 41 protrudes from the outer cylinder 41b by a length of an approximately one-third diameter thereof. Under such a condition, an engagement pin 41g presses into a through hole 41f through which the core part 41d and the outer cylinder 41b pass, whereby the outer cylinder 41b is fixed on the core part 41a together with the quartz ball 41c to form the lift pin 41. Here, members other than the quartz ball 41c are metal.

Although quartz is a suitable material capable of resisting high temperature environment, it is difficult to make the lift pins 41 entirely from quartz. Then, only the quartz ball 41c at the tip portion is made from quartz as mentioned above, whereby suppressed costs are obtainable. Moreover, quartz has hardness slightly lower than a single-crystal silicon used as a material of the substrate W. This leads to a low possibility of damages on the lower face of the substrate W. In addition, this achieves a minimized contact area since the quartz ball is spherical.

The casing 13 covers above the heat treating plate 7 to form the heat treatment atmosphere by the heat treating plate 7. The casing 13 has one face where a load/unload opening 43 is formed. The load/unload opening 43 opens at a position higher than that near the top face of the heat treating plate 7. The transfer arm 17 loads/unloads the substrate W through the load/unload opening 43.

The load/unload opening 43 has a shutter unit 15 attached thereto. The shutter unit 15 includes a drive mechanism 45, a control device 46, and a shutter body 47. The drive mechanism 45 is directly attached to the water-cooling base plate 5 tightly and partially for heat conduction in such a state that a part thereof with an operating shaft is directed upwardly. The upper part of the operating shaft is connected to the shutter body 47. The drive mechanism 45 is directly operated by the control device 46 provided with an air valve, an electromagnetic valve, and the like. When the control device 46 causes the drive mechanism 45 to extend the operating shaft, the shutter body 47 moves upwardly to close the load/unload opening 43 (illustrated by solid lines in FIG. 1). When the control device 46 causes the drive mechanism 45 to retract the operating shaft, the shutter body 47 moves downwardly to open the load/unload opening 43 (illustrated by chain double-dashed lines in FIG. 1).

Here, the drive mechanism 45 and the control device 46 correspond to the "shutter body drive mechanism" in the present invention.

The casing 13 has the ceiling where an exhaust port 49 is formed. The exhaust port 49 is in communication with an exhaust pipe 51. The exhaust port 49 of the casing 13 is spaced away from the top face of the heat treating plate 7 by a gap of approximately 30 mm, for example. The exhaust pipe 51 is in communication with an exhaust set-up not shown. A pressure sensor 53 is disposed on a part of the exhaust pipe 51. The pressure sensor 53 detects exhaust pressure within the exhaust pipe 51.

The casing 13 includes a sheathed heater 55 disposed along the top face of the exhaust pipe 51. The sheathed heater 55 heats the casing 13 and the exhaust pipe 51, and prevents adhesion of sublimate to an inner wall of the casing 13 when gas containing the sublimate contacts the casing 13 to be cooled.

A controller 61 is formed by a CPU and a memory not shown. The controller 61 performs the following control as under: temperature control of the heat treating plate 7, lifting control of the movable top board unit 9 through operation of the control device 30, drive control of the lift pin unit 11 through operation of the control device 38, open/close control of the shutter unit 15 through operation of the control device 46, temperature control of the sheathed heater 55, and exhaust control based on the pressure sensor 53. Moreover, the controller 61 performs maintenance instructions. Moreover, the controller 61 is capable of operating the lowered position during the lift control of the movable top board unit 9 in various manners depending on the substrate W. For instance, recipes that specify a treatment condition or a procedure for every substrate W are prepared to include one to define the lowered position of the movable top board 33. Then, an instruction unit, not shown, operates to provide to the recipes a parameter that corresponds to a gap between the movable top board 33 and a surface of the substrate W. When the substrate W is treated, for example, the controller 61 refers to the recipe depending on the substrate W under the instruction by a device operator, and operates the lifting mechanism 29 in accordance with the parameter. This yields adjustment of the lowered position of the movable top board 33 for every substrate W.

Figure 4:
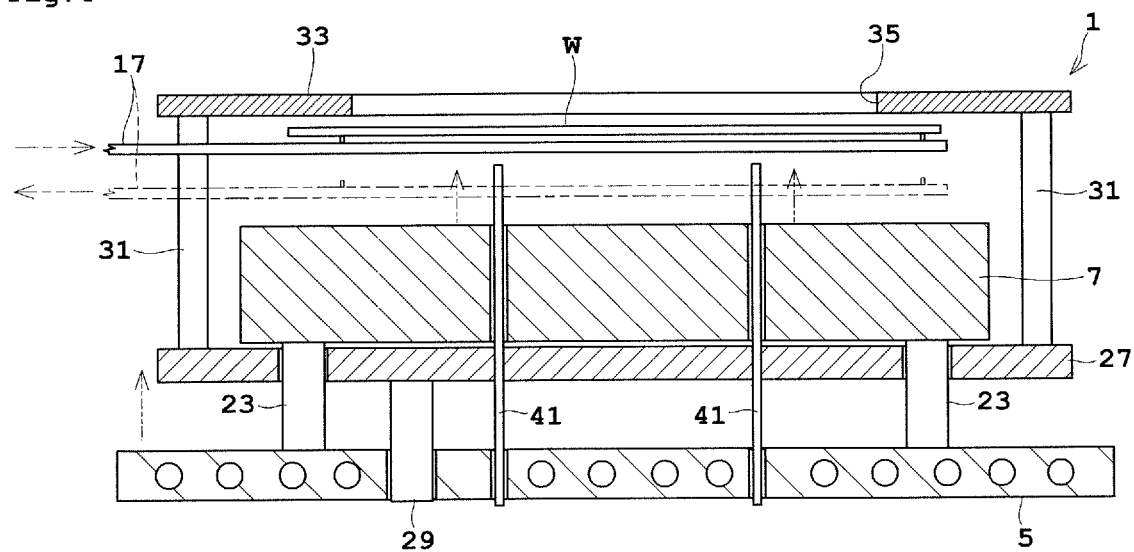
FIG. 4 is a longitudinal sectional view of loading/unloading a substrate.
Figure 5:
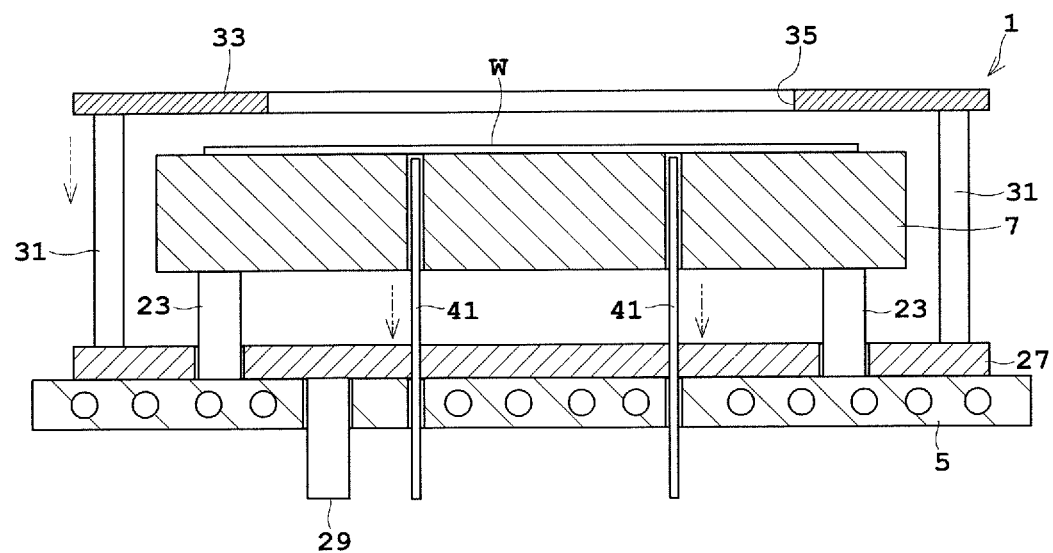
FIG. 5 is a longitudinal sectional view of heating the substrate.

Next, the following describes treatment of the substrate W by the substrate treating apparatus having the above-described configuration with reference to FIGS. 4 and 5. FIG. 4 is a longitudinal sectional view of loading/unloading the substrate. FIG. 5 is a longitudinal sectional view of heating the substrate.

Firstly, as illustrated in FIG. 4, the controller 61 operates the movable top board unit 9 to move the movable top board 33 to the raised position. In addition, the controller 61 operates the lift pin unit 11 to move the three lift pins 41 to the deliver position. Along with such operation, the controller 61 operates the shutter unit 15 to open the load/unload opening 43.

Then, the controller 61 causes the transfer arm 17 to enter through the load/unload opening 43 while the transfer arm 17 is disposed at a position higher than the deliver position and lower than the lower face of the movable top board in the raised position, and to move downwardly above the heat treating plate 7. This causes the substrate W to be delivered to the lift pins 41 in the deliver position. Thereafter, the transfer arm 17 is caused to move backwardly through the load/unload opening, and the shutter unit 15 is operated to close the load/unload opening 43.

Thereafter, as illustrated in FIG. 5, the controller 61 operates the lift pin unit 11 to move the three lift pins 41 to the treatment position. Accordingly, a heat treatment is performed to the substrate W at 400° C. The controller 61 refers to the recipe to perform the heat treatment for a defined heating time.

After a given heating time elapses, the controller 61 operates the movable top board unit 9 and the lift pin unit 11 to move the movable top board 33 upwardly to the raised position and to move the lift pin 41 upwardly to the deliver position, respectively. Then, the controller 61 operates the shutter unit 15 to open the load/unload opening 43. Moreover, the controller 61 causes the transfer arm 17 to enter through the load/unload opening 43 at a position below the deliver position and above the top face of the heat treating plate 7. Then, the transfer arm 17 is caused to move upwardly to the position higher than the deliver position and lower than the lower face of the movable top board 33, thereby receiving the treated substrate W from the lift pins 41. Thereafter, the transfer arm 17 is caused to move backwardly through the load/unload opening 43, thereby unloading the treated substrate W.

The heat treatment to one substrate W is completed by a series of operation mentioned above. When another new substrate W is to be treated, the controller 61 is capable of referring to the recipe under the instruction by the device operator to adopt the raised position of the movable top board 33 by the movable top board unit 9 as the recipe.

With this embodiment, the water-cooling base plate 5 performs heat separation, leading to suppression in heat transmission from the heat treating plate 7 downwardly of the heat treating plate 7. Accordingly, this allows suppression in heat transmission from the heat treating plate 7 to the lifting mechanism 29, the drive mechanisms 37, 45, and the control devices 30, 38, 46 disposed below the cooling base plate 5. As the result, the lifting mechanism 29, the drive mechanisms 37, 45, and the control devices 30, 38, 46 are capable of being disposed inside of the casing 13 without any large gap downwardly from the heat treating plate 7. This achieves a reduced footprint of the substrate treating apparatus 1 with a suppressed height.

Moreover, the heat treating plate 7 is attached while the lower face thereof is spaced away from the water-cooling base plate 5 via the four struts 23. Consequently, this allows the heat by the heat conduction from the heat treating plate 7 to be transmitted from only the four struts 23. As a result, suppression in rise of temperature of the water-cooling base plate 5 by the heat conduction is performable, leading to an increased degree of heat separation by the water-cooling base plate 5.

Moreover, the lifting mechanism 29 and the drive mechanisms 37, 45 are tightly attached to the top face of the water-cooling base plate 5 entirely or partially for heat conduction. This achieves cooling of the lifting mechanism 29 and the drive mechanisms 37, 45, leading to prevention of failures due to heat influences. Consequently, enhanced availability of the substrate treating apparatus 1 is performable.

<Modification>

Figure 6:
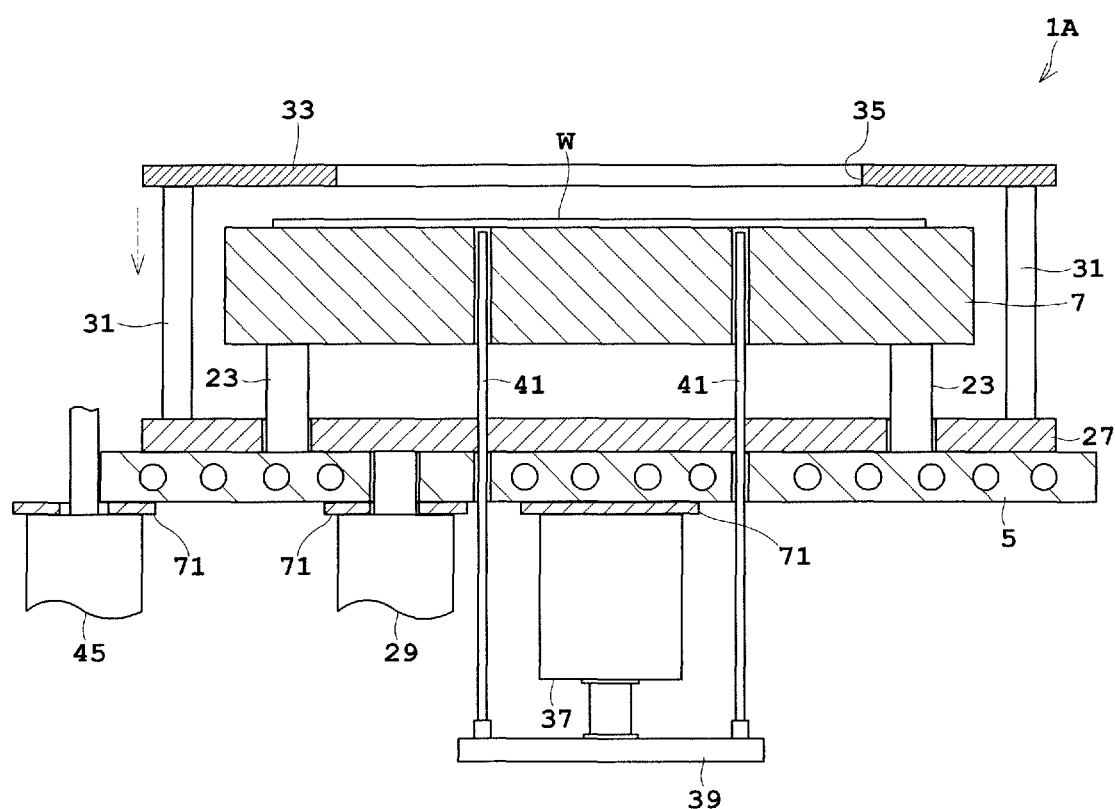
FIG. 6 is a longitudinal sectional view of another example of attaching a lifting mechanism and a drive mechanism.

Instead of the substrate treating apparatus 1 described above, such a configuration of a substrate treating apparatus 1A is adoptable. Reference is now made to FIG. 6. FIG. 6 is a longitudinal sectional view of another example of attaching a lifting mechanism and a drive mechanism.

The substrate treating apparatus 1A differs in attachment of the lifting mechanism 29 and the drive mechanisms 37, 45 to the water-cooling base plate 5.

The top faces of the lifting mechanism 29 and the drive mechanisms 37, 45 are attached to the lower face of the water-cooling base plate 5 via attachment plates 71. The attachment plates 71 are each made from a material with heat conductivity (heat conductive member.) Specifically, examples of the material include a stainless steel sheet, aluminum, and copper.

With the substrate treating apparatus 1A as described above, the lifting mechanism 29, and the drive mechanisms 37, 45 are capable of being attached to the cooling base plate 5 in various manners. This leads to an enhanced flexibility for attachment.

The present invention is not limited to the foregoing examples, but may be modified as follows.

(1) The embodiments described above each include the movable top board 33. However, the movable top board 33 is not an essential component in the present invention.

(2) In the embodiments described above, the lifting mechanism 29 of the movable top board unit 9, the drive mechanism 37 of the lift pin unit 11, and the drive mechanism 45 of the shutter unit 15 are attached to the water-cooling base plate 5 tightly or via the heat conductive member. However, such arrangement is not limitative in the present invention. For instance, the components described above may be spaced away downwardly from the water-cooling base plate 5. Such a configuration requires no larger downward gap than usual, avoiding the apparatus with a too much height.

Figure 7:
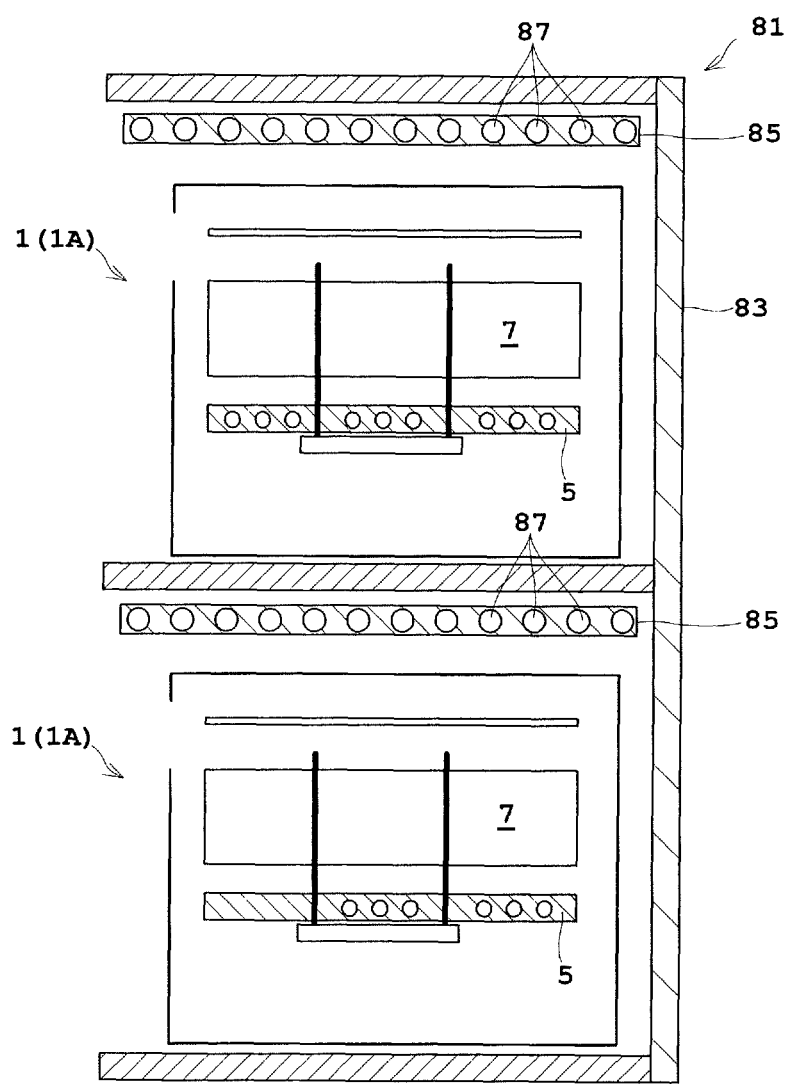
FIG. 7 schematically illustrates a substrate treating system having two substrate treating apparatus multilayered therein.

(3) In the embodiments described above, one substrate treating apparatus 1 or one substrate treating apparatus 1A are each described as one example. However, the present invention is applicable to a substrate treating system having substrate treating apparatus 1 and 1A layered in a stack manner. Reference is now made to FIG. 7. FIG. 7 schematically illustrates a substrate treating system having two substrate treating apparatus multilayered therein.

A substrate treating system 81 includes two substrate treating apparatus 1(1A) described above arranged in a stack manner. A unit casing 83 is provided for obtaining divided two-story spaces in which the substrate treating apparatus 1(1A) are each arranged. Heat separation plates 85 each include a pipe 87 made from a stainless steel sheet, for example, that is provided inside thereof or on either the upper face or the lower face. A refrigerant such as cooling water flows in the pipe 87. Each of the heat separation plates 85 is spaced away from the heat treating plate 7. Accordingly, the heat separation plates 85 each may have cooling performance lower than that of the water-cooling base plate 5. Each of the heat separation plates 85 is attached to the ceiling of the space where the substrate treating apparatus 1(1A) is arranged. The heat separation plates 85 each achieve suppression in heat transmission from the heat treating plate 7 in the substrate treating apparatus 1(1A). Consequently, this suppresses transmission of the heat of the lower substrate treating apparatus 1(1A) to the upper substrate treating apparatus 1(1A) from the below to heat the lifting mechanism 29, the control device 30, the drive mechanisms 37, 45, and the control device 38, 46 of the upper substrate treating apparatus 1(1A). Accordingly, this allows suppression in enlarged footprint and in height of the substrate treating system. Moreover, this also allows suppression in heating the uppermost face of the unit casing 83 of the substrate treating system 81, leading to a smaller clearance to the ceiling of a clean room and higher flexibility in arrangement of the substrate treating system.

(4) In the embodiments described above, the water-cooling base plate 5 is adopted as the cooling base plate. However, the present invention is not limitative to this configuration as the cooling base plate. For instance, a refrigerant other than water may flow into the refrigerant channel. Moreover, an electronic cooling base plate is adoptable that includes Peltier elements thorough which current passes for producing a cooling effect.

(5) In the embodiments described above, the lifting mechanism 29 and the drive mechanisms 37, 45 are each formed by the air cylinder. However, the present invention is not limitative to this configuration. In other words, instead of the air cylinder, a motor is adoptable for the lifting mechanism 29, and the drive mechanisms 37, 45.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus that performs a heat treatment to a substrate, the apparatus comprising:
   a heat treating plate that heats the substrate placed thereon;
   lift pins that deliver the substrate;
   a lift pin drive mechanism that causes the lift pins to move upwardly/downwardly relative to a top face of the heat treating plate;
   a casing that covers surroundings of the heat treating plate to produce a heat treatment atmosphere by the heat treating plate; and
   a cooling base plate above which the heat treating plate is placed to suppress transmission of heat from the heat treating plate downwardly, the lift pin drive mechanism being disposed below the cooling base plate,
   wherein the casing includes a load/unload opening that is used for loading/unloading the substrate;
   a shutter body that opens/closes the load/unload opening; and
   a shutter body drive mechanism that drives the shutter body, the shutter body drive mechanism being disposed below the cooling base plate.

2. The substrate treating apparatus according to claim 1, wherein
   the lift pin drive mechanism is attached to a lower face of the cooling base plate in such a condition that heat conduction is performed between the lift pin drive mechanism and the cooling base plate.

3. The substrate treating apparatus according to claim 2, wherein
   the cooling base plate includes a refrigerant channel formed thereover for causing a refrigerant to flow.

4. The substrate treating apparatus according to claim 3, further comprising:
   a plurality of struts disposed between a lower face of the heat treating plate and a top face of the cooling base plate, wherein
   the heat treating plate is attached to the cooling base plate via the plurality of struts.

5. The substrate treating apparatus according to claim 2, further comprising:
   a plurality of struts disposed between a lower face of the heat treating plate and a top face of the cooling base plate, wherein the heat treating plate is attached to the cooling base plate via the plurality of struts.

6. A substrate treating system including the substrate treating apparatus according to claim 2 multilayered in a stack manner, the substrate treating apparatus each having in an upper portion thereof a heat separation plate that suppresses upward heat transmission.

7. The substrate treating apparatus according to claim 1, wherein the shutter body drive mechanism is attached to a lower face of the cooling base plate in such a condition that heat conduction is performed between the shutter body drive mechanism and the cooling base plate.

8. The substrate treating apparatus according to claim 7, wherein the cooling base plate includes a refrigerant channel formed thereover for causing a refrigerant to flow.

9. The substrate treating apparatus according to claim 8, further comprising:

a plurality of struts disposed between a lower face of the heat treating plate and a top face of the cooling base plate, wherein the heat treating plate is attached to the cooling base plate via the plurality of struts.

10. The substrate treating apparatus according to claim 7, further comprising:

a plurality of struts disposed between a lower face of the heat treating plate and a top face of the cooling base plate, wherein the heat treating plate is attached to the cooling base plate via the plurality of struts.

11. A substrate treating system including the substrate treating apparatus according to claim 7 multilayered in a stack manner, the substrate treating apparatus each having in an upper portion thereof a heat separation plate that suppresses upward heat transmission.

12. The substrate treating apparatus according to claim 1, wherein the cooling base plate includes a refrigerant channel formed thereover for causing a refrigerant to flow.

13. The substrate treating apparatus according to claim 12, further comprising:

a plurality of struts disposed between a lower face of the heat treating plate and a top face of the cooling base plate, wherein the heat treating plate is attached to the cooling base plate via the plurality of struts.

14. The substrate treating apparatus according to claim 1, further comprising:

a plurality of struts disposed between a lower face of the heat treating plate and a top face of the cooling base plate, wherein the heat treating plate is attached to the cooling base plate via the plurality of struts.

15. A substrate treating system including the substrate treating apparatus according to claim 1 multilayered in a stack manner, the substrate treating apparatus each having in an upper portion thereof a heat separation plate that suppresses upward heat transmission.

* * * * *